United States Patent [19]
Yokota et al.

[11] Patent Number: 5,671,201
[45] Date of Patent: Sep. 23, 1997

[54] PULLING-IN CIRCUIT FOR PLL CIRCUIT, PULLING-IN METHOD FOR PLL CIRCUIT, PLL CIRCUIT DEVICE AND APPARATUS FOR REPRODUCING OPTICAL DISC

[75] Inventors: Hiroshi Yokota; Ryuichi Naito; Hiroyuki Hirano; Katsumi Ishii; Shinichi Naohara; Yoshifumi Tsukada, all of Tokorozawa; Kanya Matsumoto, Tokyo-to, all of Japan

[73] Assignee: Pioneer Electronic Corporation, Tokyo-to, Japan

[21] Appl. No.: 740,386

[22] Filed: Oct. 29, 1996

Related U.S. Application Data

[62] Division of Ser. No. 540,982, Oct. 11, 1995.

[30] Foreign Application Priority Data

Oct. 14, 1994 [JP] Japan ..................................... 6-249873

[51] Int. Cl.⁶ ..................................................... G11B 7/00
[52] U.S. Cl. .................................. 369/50; 369/48; 369/59; 360/51
[58] Field of Search ........................... 369/50, 47, 48, 369/49, 58, 54, 59, 60, 124, 32; 360/48, 51, 53

[56] References Cited

U.S. PATENT DOCUMENTS 5,469,417  11/1995  Tanoue et al. ......................... 369/50
5,553,043  9/1996  Yamaguchi et al. ..................... 369/50

*Primary Examiner*—Muhammad N. Edun
*Attorney, Agent, or Firm*—Young & Thompson

[57] ABSTRACT

A PLL circuit, to which an input signal is inputted, is provided with: a voltage controlled oscillator for outputting an output signal; a control voltage generation circuit for generating a control voltage to lock phases of the input and output signals by a loop, and outputting the generated control voltage to a control input terminal of the voltage controlled oscillator; and a central frequency setting circuit for setting a central frequency, to which a frequency of the output signal is to be pulled-in, to the control voltage generation circuit. A pulling-in circuit for the PLL circuit is provided with: a sweep range setting circuit for setting a sweep range, where the frequency of the output signal is to be pulled-in to the set central frequency, on the basis of the set central frequency; a lock detector for detecting whether or not a pulling-in operation is completed in the PLL circuit, and outputting a lock signal when the pulling-in operation is detected to be completed; and a sweep range control circuit for controlling the control signal generation circuit to generate the control signal to repeatedly sweep the frequency of the output signal through the set sweep range during the pulling-in operation until the lock signal is supplied thereto.

16 Claims, 5 Drawing Sheets

FIG. 4 COMPARISON EXAMPLE

PULLING-IN CIRCUIT FOR PLL CIRCUIT, PULLING-IN METHOD FOR PLL CIRCUIT, PLL CIRCUIT DEVICE AND APPARATUS FOR REPRODUCING OPTICAL DISC

This application is a division of copending application Ser. No. 08/540,982, filed Oct. 11, 1995.

BACKGROUND OF THE INVENTION

1. Field of the Invention

The present invention generally relates to a pulling-in circuit for a PLL (Phase Locked Loop) circuit and an apparatus for reproducing an optical disc by use of the pulling-in circuit, and more particularly relates to the pulling-in circuit and the reproducing apparatus used in a case where a frequency to follow up (i.e. the clock frequency) is drastically changed, in a case of reproducing a CLV (Constant Linear Velocity) type disc by a CAV (Constant Angular Velocity) reproducing operation, for example.

2. Description of the Related Art

The CD for music is well known as an information record medium which has a memory capacity of large volume. Thus, there has been developed a CD-ROM, which is a CD recorded with the computer readable data such as program and data base instead of music signals. The CD-ROM is advantageous in that it is suitable for the mass production so that the production cost is relatively low. Thus, the CD-ROM has been a very popular record medium for the recent multi-media.

Since the CD-ROM is recorded with the data for computer or the compressed digital video signals etc. instead of the music signals, from the view point of keeping the high recording density, the CD-ROM is basically recorded as a CLV type record medium, i.e. recorded by the constant linear velocity, in the same manner as the CD for music. The CLV recording and reproducing method is a method in which the primary importance is given to the record density rather than the access time i.e. the time required for the optical pickup to move to a specific position where the desired data to be accessed are recorded on the optical disc.

In case that optical disc is used as an external ROM for the computer, it is preferable to decrease the access time. However, in case of the CD-ROM of CLV type, in order to keep the linear velocity constant during the rotation of the optical disc, it is necessary to change the rotation angular velocity in accordance with the radial position on the optical disk. Namely, the rotation angular velocity for reading a position near the inner circumference on the optical disc should be much higher than that near the outer circumference on the optical disc in the CLV type reproduction. Here, since the change in the rotation angular velocity of the disc requires a certain period of time, the CD disc of CLV type has an essential disadvantage to decrease the access time.

Therefore, there may be proposed to reproduce the CD disc of CLV type by the CAV type reproducing operation to reduce the access time. However, since data on the CD disc of CLV type are recorded on the assumption that they will be reproduced under the condition that the linear velocity is constant (i.e. by the CLV reproducing operation), if the CD disc of CLV type would be reproduced under the condition that the angular velocity is constant (i.e. by the CAV reproducing operation), the transmission rate of the data is greatly changed between the reproduction near the outer circumference of the disc and the reproduction near the inner circumference of the disc. In other words, the record density is apparently increased more as the optical pickup moves outward on the CLV disc during the CAV type reproducing operation, so that the transmission rate is increased more as the optical pickup moves outward.

More concretely, assuming that the number of rotation of the disc is about 1000 r.p.m. (rotation per minute), the data transmission rate (i.e. the rate of reading out the data) is about 350 kBytes/sec at the most inner circumference on the disc (which corresponds to about 2.8 MHz when converted into the clock frequency) while it is about 875 kBytes/sec at the most outer circumference on the disc (which corresponds to about 7 MHz when converted into the clock frequency). Namely, the difference in the transmission rate therebetween is as much as about 2.5 times.

In this case, in order to read the record information on the optical disc, it is necessary to change the frequency of an output clock signal for reading operation in accordance with the change in the data transmission rate (i.e. the clock frequency to follow up). The clock signal is generated by a PLL (Phase Locked Loop) circuit and is used for a servo control for the spindle motor which rotates the optical disc, tracking and focusing servo controls for the optical pickup which read the information on the optical disc, a carriage servo control for the carriage which carry the optical pickup, and so on. The PLL circuit generates the output clock signal such that the frequency and phase of the output clock signal is changed in accordance with the reading position on the optical disc. In order to achieve the oscillation in the certain frequency and phase range to follow up the data transmission rate (input clock signal) during the reproduction, the PLL circuit is provided with a pulling-in circuit to pull-in the oscillation within the sweep frequency range having a predetermined width into the frequency corresponding to the data transmission rate.

However, if the CLV type disc is reproduced by the CAV type reproducing operation, the PLL operation is difficult since the stable and speedy pulling-in operation for the PLL circuit is difficult due to the drastic change in the transmission rate along the radial direction on the CLV disc.

Namely, in the above mentioned PLL circuit, regardless of the reading position of the optical pickup, i.e. regardless of the radial position on the optical disc corresponding to the reading position, the sweep frequency range for pulling-in (corresponding to Vm to Vn) is fixed. That is to say, the upper and lower limit values of the sweep range are constant. Accordingly, for example, the sweep range suitable for performing the pulling-in operation with respect to the clock frequency at the inner circumference side, where the transmission rate is relatively low, becomes relatively narrow at the outer circumference of the optical disc where the transmission rate is relatively high, resulting that it is difficult to perform the stable pulling-in operation at the outer circumference, which is a serious problem in a practical sense.

On the other hand, the sweep range suitable for the pulling-in operation with respect to the clock frequency at the outer circumference where the transmission rate is relatively high, becomes relatively too wide at the inner circumference side of the optical disc, resulting in that the time required for pulling-in becomes too long at the inner circumference, which is another problem.

Further, in an optical disc reproducing apparatus using this kind of PLL circuit, in case that the CAV reproducing operation is performed with respect to the CLV disc, the clock frequency range to deal with is too wide, so that the problems same as the above may be raised.

SUMMARY OF THE INVENTION

It is therefore an object of the present invention to provide a pulling-in circuit for a PLL circuit, a pulling-in method for the PLL circuit, a PLL circuit device having the PLL circuit and the pulling-in circuit, and an apparatus for reproducing an optical disc, in which a stable and speedy pulling-in operation of the PLL circuit can be performed.

The above object of the present invention can be achieved by a pulling-in circuit for a PLL circuit to which an input signal is inputted. The PLL circuit is provided with: a voltage controlled oscillator for outputting an output signal; a control voltage generation circuit for generating a control voltage to lock phases of the input and output signals by a loop, and outputting the generated control voltage to a control input terminal of the voltage controlled oscillator; and a central frequency setting circuit for setting a central frequency, to which a frequency of the output signal is to be pulled-in, to the control voltage generation circuit. The pulling-in circuit is provided with: a sweep range setting circuit for setting a sweep range, where the frequency of the output signal is to be pulled-in to the set central frequency, on the basis of the set central frequency; a lock detector for detecting whether or not a pulling-in operation is completed in the PLL circuit, and outputting a lock signal when the pulling-in operation is detected to be completed; and a sweep range control circuit for controlling the control signal generation circuit to generate the control signal to repeatedly sweep the frequency of the output signal through the set sweep range during the pulling-in operation until the lock signal is supplied thereto.

In the operation of the PLL circuit by use of the pulling-in circuit of the present invention, the sweep range, where the frequency of the output signal is to be pulled-in to the set central frequency, is set on the basis of the set central frequency, by the sweep range setting circuit. During the pulling-in operation, it is detected by the lock detector whether or not a pulling-in operation is completed in the PLL circuit. Then, when the pulling-in operation is detected to be completed, the lock signal is outputted by the lock detector. Then, the control signal generation circuit is controlled by the sweep range control circuit to generate the control signal, so that the frequency of the output signal is repeatedly swept through the set sweep range until the lock signal is supplied to the sweep range control circuit.

In this manner, the pulling-in operation can be performed with respect to the sweep range based on the central frequency, which can be set by the central frequency setting circuit. Thus, even if the frequency of the input signal is relatively high or low, the pulling-in operation can be performed by use of a sweep range suitable for the frequency of the input signal by setting the central frequency in accordance with the frequency of the input signal according to the pulling-in circuit of the present invention.

In one aspect of the pulling-in circuit of the present invention, the central frequency setting circuit sets the central frequency by adding a central frequency voltage corresponding to the central frequency onto the control voltage. The sweep range control circuit controls the control signal generation circuit to sweep the control voltage through a voltage range corresponding to the set sweep range. Thus, the oscillation i.e. the frequency of the output signal of the voltage controlled oscillator can be easily controlled by applying the voltage prescribed by the central frequency setting circuit and the sweep range control circuit.

In this aspect of the pulling-in circuit, the control signal generation circuit may be provided with: a phase comparator for comparing the phases of the input and output signals to output a phase difference voltage; a loop filter for amplifying the phase difference voltage to output an amplified voltage which is swept through the voltage range by the sweep range control circuit; and an adder for adding the central frequency voltage onto the amplified voltage to output the control voltage. The sweep range control circuit is provided with: a direct voltage applying circuit for selectively applying one of two direct voltages, which have levels different from each other, to an input of the loop filter; and a switching circuit for switching the applied one of two direct voltages to another when the control voltage reaches each of an upper limit and a lower limit of the voltage range. Thus, the pulling-in operation can be efficiently performed in the frequency range corresponding to the voltage range between the upper limit and the lower limit, by switching the direct voltages applied to the loop filter.

Further, in this aspect of the pulling-in circuit, the sweep range setting circuit may be provided with: an upper limit setting circuit for setting an upper limit voltage of the voltage range on the basis of the central frequency voltage; and a lower limit setting circuit for setting a lower limit voltage of the voltage range on the basis of the central frequency voltage. Thus, the pulling-in operation can be efficiently performed in the frequency range corresponding to the voltage range between the upper limit voltage and the lower limit voltage set by the setting circuits. In this case, the upper limit setting circuit may set the upper limit voltage by adding a result of multiplying the central frequency voltage by a first proportional coefficient P1 (P1>0) onto the central frequency voltage, and the lower limit setting circuit may set the lower limit voltage by subtracting a result of multiplying the central frequency voltage by a second proportional coefficient P2 (P2 >0) from the central frequency voltage. Thus, the upper and lower limit voltages can be easily set such that the width of the sweep range is increased as the central frequency is increased (i.e. the width of the sweep range is proportional to the central frequency), which is quite advantageous when the pulling-in circuit is employed for the reproducing apparatus which reproduce the CLV disc by the CAV type reproducing operation.

In another aspect of the pulling-in circuit, the sweep range setting circuit may be provided with: an upper limit setting circuit for setting an upper limit value (frequency) of the sweep range on the basis of the central frequency; and a lower limit setting circuit for setting a lower limit value (frequency) of the sweep range on the basis of the central frequency. Thus, the pulling-in operation can be efficiently performed in the frequency range between the upper limit value and the lower limit value.

The above object of the present invention can be also achieved by a pulling-in method for the above mentioned PLL circuit in the pulling-in circuit of the present invention. The pulling-in method is provided with the steps of: setting a sweep range, where the frequency of the output signal is to be pulled-in to the set central frequency, on the basis of the set central frequency; detecting whether or not a pulling-in operation is completed in the PLL circuit, and outputting a lock signal when the pulling-in operation is detected to be completed; and controlling the control signal generation circuit to generate the control signal to repeatedly sweep the frequency of the output signal through the set sweep range during the pulling-in operation until the lock signal is outputted.

Accordingly, the pulling-in operation same as the above mentioned pulling-in circuit of the present invention can be performed according to the pulling-in method of the present invention, and the advantageous effect same as the pulling-in circuit of the present invention can be achieved by the pulling-in method of the present invention.

In one aspect of the pulling method of the present invention, the central frequency setting circuit may set the central frequency by adding a central frequency voltage corresponding to the central frequency onto the control voltage. The controlling step may be provided with the step of controlling the control signal generation circuit to sweep the control voltage through a voltage range corresponding to the set sweep range. Thus, the oscillation i.e. the frequency of the output signal of the voltage controlled oscillator can be easily controlled by applying the voltage prescribed by the controlling step.

In this aspect of the pulling-in method, the control signal generation circuit may be provided with: a phase comparator for comparing the phases of the input and output signals to output a phase difference voltage; a loop filter for amplifying the phase difference voltage to output an amplified voltage which is swept through the voltage range by the sweep range control circuit; and an adder for adding the central frequency voltage onto the amplified voltage to output the control voltage. The controlling step may be provided with the steps of: selectively applying one of two direct voltages, which have levels different from each other, to an input of the loop filter; and switching the applied one of two direct voltages to another when the control voltage reaches each of an upper limit value and a lower limit value. Thus, the pulling-in operation can be efficiently performed in the frequency range corresponding to the voltage range between the upper limit and the lower limit, by switching the direct voltages applied to the loop filter.

Further, in this aspect of the pulling-in method, the sweep range setting step may be provided with the steps of: setting an upper limit voltage of the voltage range on the basis of the central frequency voltage; and setting a lower limit voltage of the voltage range on the basis of the central frequency voltage. In this case, the upper limit setting step may be provided with the step of setting the upper limit voltage by adding a result of multiplying the central frequency voltage by a first proportional coefficient P1 (P1>0) onto the central frequency voltage; and the lower limit setting step comprises the step of setting the lower limit voltage by subtracting a result of multiplying the central frequency voltage by a second proportional coefficient P2 (P2>0) from the central frequency voltage. Thus, the upper and lower limit voltages can be easily set such that the width of the sweep range is increased as the central frequency is increased.

Further, in another aspect of the pulling-in method, the sweep range setting step may be provided with the steps of: setting an upper limit value (frequency) of the sweep range on the basis of the central frequency; and setting a lower limit value (frequency) of the sweep range on the basis of the central frequency. Thus, the pulling-in operation can be efficiently performed in the frequency range corresponding to the voltage range between the upper limit value and the lower limit value.

The above object can be also achieved by a PLL circuit device comprising the above mentioned PLL circuit of the present invention, and the above mentioned pulling-in circuit of the present invention. Thus, in the PLL circuit device, the pulling-in operation same as the above mentioned pulling-in circuit can be performed, so that the advantageous effect same as the pulling-in circuit of the present invention can be achieved by the pulling-in method of the present invention.

Thus, in the PLL circuit device, the pulling-in operation can be performed with respect to the sweep range based on the central frequency. Consequently, even if the frequency range to deal with in the PLL operation is wide, the PLL operation can be still performed by use of a sweep range which is varied to be suitable for the frequency of the current input signal, according to the PLL circuit device of the present invention.

In one aspect of the PLL circuit device, the central frequency setting circuit may set the central frequency by adding a central frequency voltage corresponding to the central frequency onto the control voltage, and the sweep range control circuit may control the control signal generation circuit to sweep the control voltage through a voltage range corresponding to the set sweep range. Thus, the oscillation can be easily controlled by applying the voltage prescribed by the central frequency setting circuit and the sweep range control circuit.

In another aspect of the PLL circuit device the control signal generation circuit may be provided with: a phase comparator for comparing the phases of the input and output signals to output a phase difference voltage; a loop filter for amplifying the phase difference voltage to output an amplified voltage which is swept through the voltage range by the sweep range control circuit; and an adder for adding the central frequency voltage onto the amplified voltage to output the control voltage.

The above object of the present invention can be also achieved by an apparatus for reproducing an optical disc, which is recorded with information by a constant linear velocity. The reproducing apparatus is provided with: the above mentioned PLL circuit of the present invention and the above mentioned pulling-in circuit of the present invention. An input clock signal is inputted to the PLL circuit as the input signal, while an output clock signal is outputted from the PLL circuit, in this case. The reproducing apparatus is further provided with: a rotation device for rotating the optical disc by a constant angular velocity on the basis of the output clock signal outputted by the PLL circuit; an optical pickup for reading the information from the rotated optical disc and outputting the input clock signal based on the data transmission rate of the read information; a position detection device for detecting a reading position on the rotated optical disc where the information is read by the optical pickup. The central frequency setting circuit sets the central frequency in accordance with the detected reading position.

In the operation of the reproducing apparatus, the optical disc is rotated by a constant angular velocity on the basis of the output clock signal outputted by the PLL circuit, while the information is read by the optical pickup from the rotated optical disc. Then, the input clock signal is outputted based on the data transmission rate of the read information. During reproduction, the reading position is detected by the position detection device. Then, the central frequency setting circuit sets the central frequency in accordance with the detected reading position. Accordingly, the pulling-in operation can be performed by use of the sweep range suitable for the reading position. Namely, if the reading position is near the most inner circumferential side of the optical disc where the data transmission rate is low, the relatively narrow sweep range is employed so that it is possible to perform the pulling-in operation speedily. If the reading position is near the most outer circumferential side where the data transmission rate is high, the relatively wide sweep range is employed so that it is possible to perform the pulling-in operation stably.

In one aspect of the reproducing apparatus, the information record area on the optical disc may be divided into a plurality of virtual zones in a ring shape, in each of which the optical disc is rotated by the constant angular velocity by the rotation device. Thus, the CAV type reproducing operation can be performed for each virtual zone while the pulling-in operation is always performed appropriately regardless of the radial location of the virtual zone.

The nature, utility, and further features of this invention will be more clearly apparent from the following detailed description with respect to preferred embodiments of the invention when read in conjunction with the accompanying drawings briefly described below.

DETAILED DESCRIPTION OF THE PREFERRED EMBODIMENTS

Referring to the accompanying drawings, embodiments of the present invention will be now explained.

Figure 1:
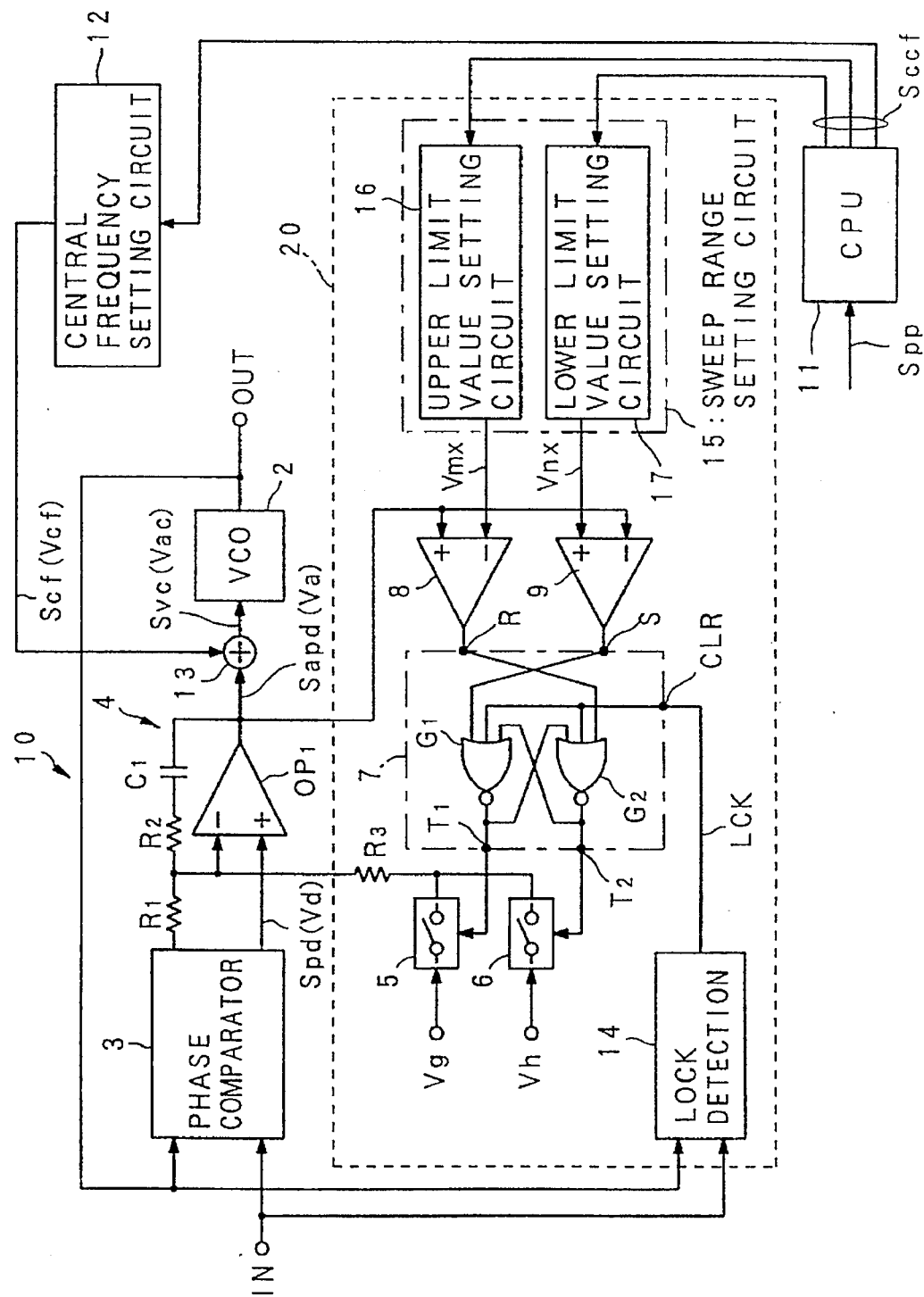
FIG. 1 is a block diagram of a PLL circuit device as a first embodiment of the present invention.

A PLL circuit as a first embodiment of the present invention is explained with referring to FIG. 1.

In FIG. 1, a PLL circuit device consists of a PLL circuit 10 and a pulling-in circuit 20. The PLL circuit 10 is provided with a VCO (Voltage Controlled Oscillator) 2, a phase comparator 3, a loop filter 4, a central frequency setting circuit 12 and an adder 13.

The VCO 2 is constructed to output an output signal OUT having a frequency corresponding to a voltage control signal Svc (i.e. a control voltage Vac). The phase comparator 3 is constructed to detect the frequency and phase difference of the output signal OUT and an input signal IN, and output a phase difference signal Spd (i.e. a phase difference voltage Vd) corresponding to the detected phase difference. The loop filter 4 is provided with a differential amplifier OP1, resistors R1 and R2 and a capacitor C1, and is constructed to amplify the phase difference signal Spd (the phase difference voltage Vd) by a predetermined amplification factor, and output it as an amplified phase difference signal Sapd (an amplified phase difference voltage Va). The central frequency setting circuit 12 is constructed to output a central frequency signal Scf (a central frequency voltage Vcf) corresponding to the central frequency which is to be set on the basis of a central frequency setting control signal Sccf from the external i.e. a CPU (Central Processor Unit) 11. The adder 13 is constructed to add the amplified phase difference signal Sapd (i.e. the amplified phase difference voltage Va) and the central frequency signal Scf (i.e. the central frequency voltage Vcf), and output it as the voltage control signal Svc (i.e. the control voltage Vac). The pulling-in circuit 20 is adapted to perform an electric voltage sweeping operation so as to pull-in the frequency of the output signal OUT of the PLL circuit 10 to the central frequency.

The pulling-in circuit 20 is provided with a first comparator 8, a second comparator 9, a flipflop circuit 7 of RS type, a first switch 5, a second switch 6, a lock detection. unit 14 and a sweep range setting circuit 15.

The first comparator 8 is constructed such that a non-inverted input terminal (+) thereof is connected with an output terminal of the differential amplifier OP1, and a first standard voltage signal (i.e. a first standard voltage Vmx) to determine the upper limit value of the sweep frequency range of the PLL circuit 10 is inputted from the sweep range setting circuit 15 to an inverted input terminal (−) thereof. The second comparator 9 is constructed such that an inverted input terminal (−) thereof is connected with the output terminal of the differential amplifier OP1, and a second standard voltage signal (a second standard voltage Vnx) to determine the lower limit value of the sweep frequency range of the PLL circuit 10 is inputted from the sweep range setting circuit 15 to a non-inverted input terminal (+) thereof. The flipflop circuit 7 is provided with a first NOR circuit G1 having three input terminals and a second NOR circuit G2 having three input terminals, and is constructed as such a R-S type flipflop circuit that the output signal of the second comparator 9 is inputted to a set terminal S thereof, the output of the first comparator 8 is inputted to a reset terminal R thereof, and a lock signal LCK is inputted from the lock detection unit 14 to a clear terminal CLR thereof, to output data through a first output terminal T1 and a second output terminal T2. The first switch 5 is constructed such that the first voltage signal (i.e. the first voltage Vg) is inputted thereto and it is switched to a closed condition when the output of the first NOR circuit G1 is at the "H" level. The second switch 6 is constructed such that the second voltage signal (i.e. the second voltage Vh) is inputted thereto, and it is switched to a closed condition when the output of the second NOR circuit G2 is at the "H" level. The lock detection unit 14 is constructed to output the lock signal LCK indicating a phase locked condition in case that the phases and frequencies of the input signal IN and the output signal OUT are within the predetermined error ranges (i.e. in case that they are almost equal to each other). The sweep range setting circuit 15 is constructed to set the sweep frequency range on the basis of the central frequency setting control signal Sccf from the external of the PLL circuit 10 i.e. the CPU 11.

The sweep range setting circuit 15 is provided with: an upper limit value setting circuit 16 for setting the first standard voltage signal (i.e. the first standard voltage Vmx) to determine the upper limit value of the sweep frequency range of the PLL circuit 10; and a lower limit value setting circuit 17 for setting the second standard voltage signal (i.e. the second standard voltage Vnx) to determine the lower limit value of the sweep frequency range of the PLL circuit 10.

Nextly, a construction of a reproducing apparatus for reproducing an optical disc as a second embodiment which includes the PLL circuit device of the first embodiment, will be explained with referring to FIG. 2. The reproducing apparatus of the second embodiment is adapted to perform a CAV type reproducing operation with respect to CLV disc, which has been recorded by the CLV type recording operation.

Figure 2:
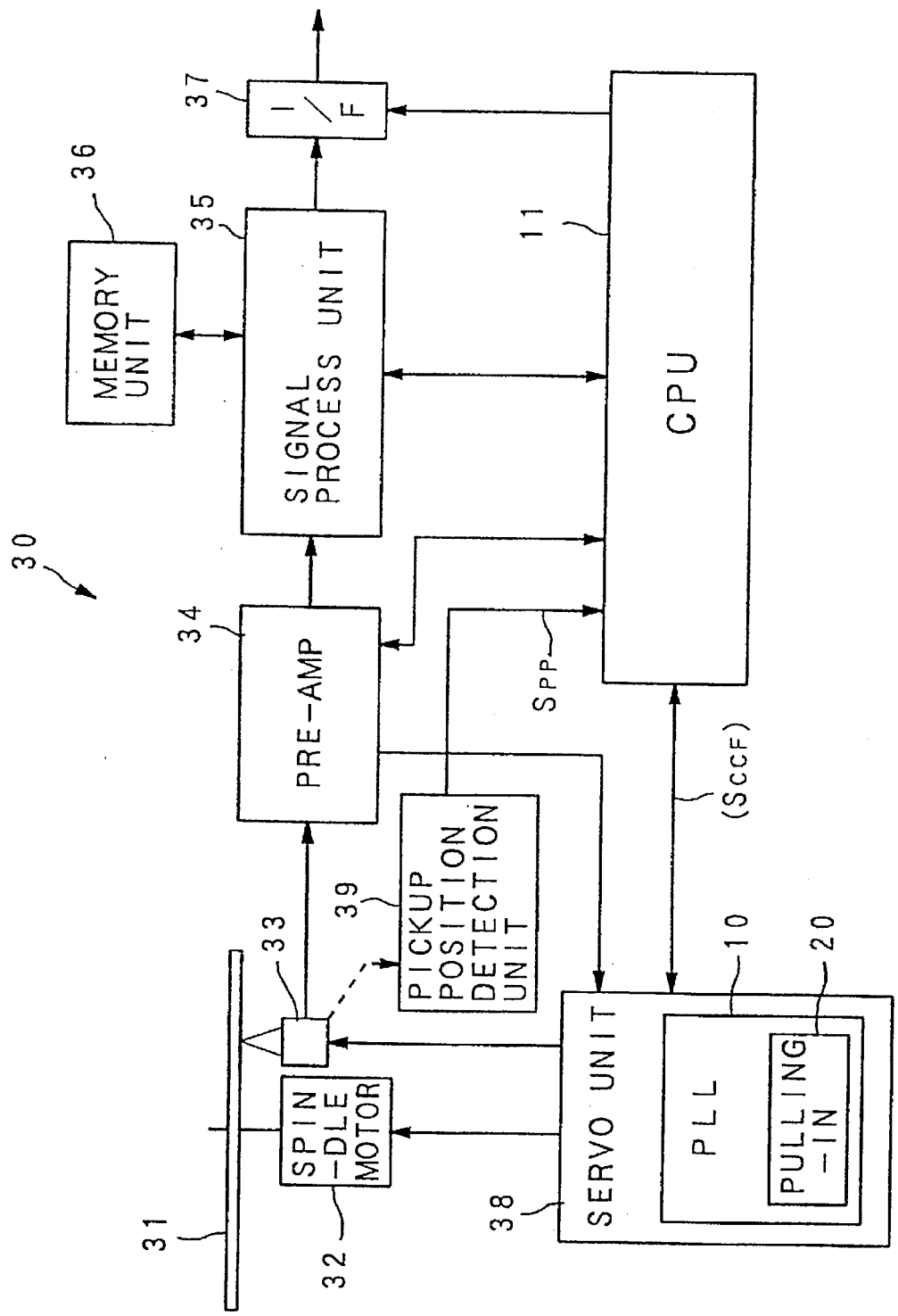
FIG. 2 is a block diagram of an apparatus for reproducing an optical disc as a second embodiment of the present invention.

In FIG. 2, a reproducing apparatus 30 for reproducing an optical disc 31 of CLV type recorded with computer readable record information, is provided with: a spindle motor 32 for driving the optical disc 31 to rotate; an optical pickup 33 for reading the record information from the rotated optical disc 31; a pre-amplifier 34 for amplifying the output signal of the optical pickup 33 and outputting the amplified signal; a signal process unit 35 for reproducing the digital data on the basis of the output signal of the preamplifier 34, and applying a signal process such as an error correcting process, a de-interleave process, etc., to the reproduced signal and outputting it as digital data; a memory unit 36 which functions as a buffer for storing the data during or after the processes by the signal process unit 35; an interface (I/F) portion 37 for performing an interface process to the digital data from the signal process unit 35 and outputting it to an external device, such as a host computer which accesses the optical disc 31; a servo unit 38 provided with the PLL circuit 10 of FIG. 1, for performing servo controls such as focusing, tracking and carriage controls, for the spindle motor 32, the optical pickup 33 and the carriage motor for driving the optical pickup 33 on the basis of the output signal of the pre-amplifier 34; an optical pickup position detection unit 39 for detecting the reading position on the optical disc 31 and outputting a position signal Spp indicating the detected position; and the CPU 11 for outputting the central frequency setting signal Sccf to control the central frequency setting circuit 12, the upper limit value setting circuit 16 and the lower limit value setting circuit 17 of FIG. 1 on the basis of the position signal Spp and controlling the whole portion of the reproducing apparatus 30.

Nextly, the operation of the embodiment will be explained with referring to FIG. 3 as well as FIGS. 1 and 2.

In this case, the first voltage Vg and the second voltage Vh are set so as to satisfy the relationship with the phase difference voltage Vg as a following expression.

$$Vg > Vd > Vh$$

The sweep range setting circuit 15 sets the first standard voltage Vmx and the second standard voltage Vnx on the basis of the center frequency setting signal Sccf outputted from the CPU 11.

The reproducing apparatus 30 is assumed to perform a CAV type reproducing operation, in which the information recorded area of the optical disc 31 recorded by the CLV type recording operation is divided into a plurality of virtual zones, such that the CAV type reproduction is performed by a constant angular velocity for each of the virtual zones. Namely, the angular velocity is constant in each virtual zone and is changed when the virtual zone including the reading. position is changed.

Here, the setting method of the first standard voltage Vmx and the second standard voltage Vnx is explained first.

A proportional coefficient P1 to determine the upper limit value is set in advance to the upper limit value setting circuit 16, and a proportional coefficient P2 to determine the lower limit value is set in advance to the lower limit value setting circuit 17, with respect to the central frequency to which the frequency is to be pulled-in (which corresponds to the central frequency setting signal Sccf).

By this, the upper limit value setting circuit 16 sets the first standard voltage Vmx according to a following expression, with respect to the central frequency voltage Vcf corresponding to the central frequency.

$$Vmx = Vcf + P1 \times Vcf$$

On the other hand, the lower limit value setting circuit 17 sets the second standard voltage Vnx according to a following expression, with respect to the central frequency voltage Vcf corresponding to the central frequency.

$$Vnx = Vcf - P2 \times Vcf$$

Here, the concrete setting method of setting the proportional coefficients P1 and P2 is explained.

In this case, it is assumed that the CD-ROM (Compact Disk ROM) having a diameter of 12 cm is employed as the optical disc 31, the record information is recorded in the information. record area where the radial position is between 23 to 58 mm, and that the pickup position detection unit 39 can distinguish this information record area into 256 different small areas.

The width in the radial direction of each small area, which can be distinguished by the pickup position detection unit 39 is about 136 μm $(=(58-23) \times 1000/256)$.

Supposing that the number of rotation of the optical disc 31 is 1000 rotations/sec, the data reading out rate (i.e. data transmission rate) is 350 kBytes/sec at the most inner circumference of the information record area (where the radius=23 mm) and that the data reading out rate is 875 kBytes/sec at the most outer circumference of the information record area (where the radius=58 mm), for example.

Therefore, the changing rate DRR of the data reading out rate per unit distance (1 m) is obtained by a following expression.

$$DRR = (875 - 350)/((58 - 23)/1000)$$
$$= 15[\text{mBytes/sec/m}]$$

If this is converted to the value per 136 μm (which is the width in the radial direction of each small area, which can be distinguished by the pickup position detection unit 39), it becomes as following.

$$136 \, [\mu m] \times 15 \, [\text{MBytes/sec/m}] = 2.04 \, \text{kBytes/sec}$$

Thus, it is changed by about 2 kBytes per each distinguishable small area.

On the other hand, since the data reading out rate is 350 kBytes/sec at the most inner circumference, supposing that the sweep range is set in a frequency range of 3 times as wide as this data reading out rate on the upper and lower sides with respect to the central frequency corresponding to this data reading out rate (i.e. 2 KBytes/sec×3 times), the sweep range SWA becomes as following.

$$344 \, \text{kBytes/sec} < SWA < 356 \, \text{KBytes/sec}.$$

Therefore, the rate corresponding to the sweep range with respect to the central frequency i.e. the proportion coefficients P1 and P2 are determined as following.

$$P1 = P2 = 2 \times 3/350 = 1/58$$

And, even in case that the central frequency is changed, the proportional coefficients P1 and P2 are constant.

Therefore, for example, in case that the central frequency=875 kBytes/sec (which is the frequency at the most outer circumference of the disc), the sweep range becomes as following.

$$875 - (875 \times (1/58)) < SWA < 875 + (875 \times (1/58))$$

i.e. 860 kBytes/sec<SWA<890 kBytes/sec

In the above explanations, although the proportional coefficient P1 is equal to the proportional coefficient P2, it is not really necessary to make those coefficients P1 and P2 equal to each other. Those coefficients P1 and P2 may be set as different and voluntary values in the above explained manner.

Nextly, the concrete operation of the PLL circuit of. the present embodiment will be explained with referring to FIG. 3. In this case, it is assumed that the reproduction is performed from the inner circumference side toward the outer circumference side of the optical disc, and that the optical disc is divided into x virtual zones. More concretely, it is assumed that the most inner circumference side is the first virtual zone, the most outer circumference side is the xth zone, and that the reproduction is performed from the first virtual zone toward the xth virtual zone.

Figure 3:
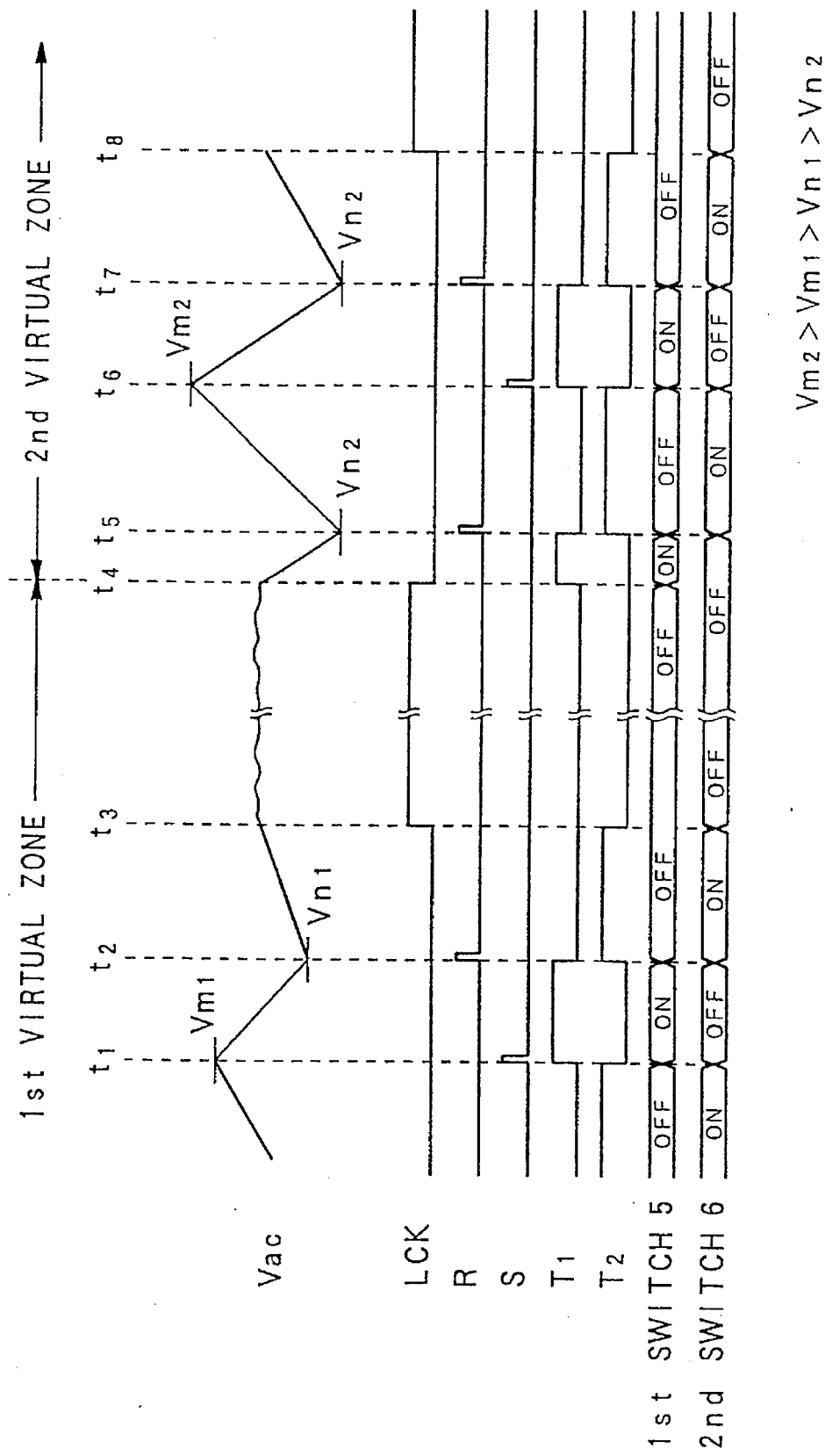
FIG. 3 is a timing chart for explaining an operation of the embodiments.

In FIG. 3, until the time t1, the signal level at the first output terminal T1 of the flipflop 7 is the "L (Low)" level, and the signal level at the second output terminal T2 is at the "H (High)" level. Thus, the first switch 5 is in the open (OFF) condition, and the second switch 6 is in the close (ON) condition.

By those signal levels and switch conditions, the second voltage Vh, which is lower than the phase difference voltage Vd, is applied to the inverted input terminal of the loop filter 4. Thus, the loop filter 4 functions as an integrator for integrating the differential input (Vd–Vh).

As a result, the control voltage Vac of the voltage control signal is increased, so that the frequency of the output signal OUT is also increased.

At the time t1, the control voltage Vac reaches the first standard voltage Vm1 corresponding to the first virtual zone, and the output level of the first comparator 8 becomes the "H" level.

By this, the output of the flipflop circuit 7 is inverted, so that the signal level at the first output terminal T1 becomes the "H" level, and the signal level at the second output terminal T2 becomes the "L" level. Thus, the first switch 5 becomes in the close condition, and the second switch 6 becomes in the open condition.

Therefore, the first voltage Vg, which is higher than the phase difference voltage Vd is applied to the inverted input terminal of the loop filter 4, so that the loop filter 4 functions as the integrator for integrating the differential input (Vd–Vg). Then, the control voltage Vac of the voltage control signal is decreased, and along with this, the frequency of the output signal OUT is also decreased.

By the way, since the control voltage Vac is decreased to be lower than the first standard voltage Vm1, the output level of the first comparator 8 immediately becomes the "L" level. However, this immediate level change does not affect the flipflop circuit 7.

After that, the control voltage Vac is kept to be decreased, and at the time t2, it reaches the second standard voltage Vn1. Thus, the output level of the second comparator 9 becomes the "H" level.

By this, the output of the flipflop circuit 7 is inverted, and the signal level at the first output terminal T1 becomes the "L" level, while the signal level of the second output terminal becomes the "H" level. Thus, the first switch 5 becomes in the open condition, and the second switch 6 becomes in the close condition.

Therefore, the second voltage Vh, which is lower than the phase difference voltage Vd, is applied again to the inverted input terminal of the loop filter 4, so that the loop filter 4 functions as the integrator for integrating the differential input (Vd–Vh). Then, the control voltage Vac of the voltage control signal is increased, and along with this, the frequency of the output signal OUTPUT is also increased.

Then, at the time t3, when the phases of the input signal IN and the output signal OUT are coincident to each other, the lock signal LCK of the lock detection unit 14 becomes at the "H" level to indicate that the pulling-in operation is completed. Both of the first output terminal T1 and the second output terminal T2 of the flipflop circuit 7 become at the "L" levels respectively, and both of the first switch 5 and the second switch 6 become in the open conditions respectively. Thus, the pulling-in circuit 20 is cut off (i.e. electrically separated) from the PLL circuit 10, and after that, the PLL circuit 10 starts to normally operate.

Then, at the time t4, when the reproduction end of the first virtual zone is detected on the basis of the position signal Spp, the CPU 11 outputs the central frequency setting signal Sccf, which corresponds to the second virtual zone, to the central frequency setting circuit 12, the upper limit value setting circuit 16 and the lower limit value setting circuit 17.

By this, the central frequency setting circuit 12 sets the central frequency signal Scf corresponding to the second virtual zone, and the signal level of the lock signal LCK becomes the "L" level since the PLL circuit 10 is now in the out-of-phase condition.

By this, the signal levels at both inputs of the first gate circuit G1 and the second gate circuit G2 in the flipflop circuit 7 become the "L" level. By the first gate circuit G1 and the second gate circuit G2 at that time, the condition of the flipflop circuit 7 is determined such that the signal level at one of the first output terminal T1 and the second output terminal T2 becomes "H" level, and the signal level at the other becomes the "L" level.

For example, supposing that the signal level at the first output terminal T1 is the "H" level and the signal level at the second output terminal T2 is the "L" level, the first switch 5 becomes in the close condition and the second switch 6 becomes in the open condition.

Therefore, the first voltage Vg, which is higher than the phase difference voltage Vd, is applied to the inverted input terminal of the loop filter 4, so that the loop filter 4 functions as the integrator for integrating the differential input (Vd–Vg). Then, the control voltage Vac of the voltage control signal is decreased, and along with this, the frequency of the output signal OUT is also decreased.

After that, the control voltage Vac is kept to be decreased, and at the time t5, it reaches the second standard voltage Vn2 corresponding to the second virtual zone, and the output level of the second comparator 9 becomes the "H" level.

By this, the output of the flipflop circuit 7 is inverted, so that the signal level at the first output terminal T1 becomes the "L" level and the signal level of the second output terminal T2 becomes the "H" level. Thus the first switch 5 becomes in the open condition an the second switch 6 becomes in the close condition.

Therefore, the second voltage Vh, which is lower than the phase difference voltage Vd, is applied again to the inverted input terminal of the loop filter 4, so that the loop filter 4 functions as the integrator for integrating the differential input (Vd–Vh). Thus, the control voltage Vac of the voltage control signal is increased, and along with this, the frequency of the output signal OUT is also increased.

At the time t6, the control voltage Vac reaches the first standard voltage Vm2 corresponding to the second virtual zone, and the output level of the first comparator 8 becomes the "H" level.

By this, the output of the flipflop circuit 7 is inverted, so that the signal level at the first output terminal T1 becomes the "H" level, and the signal level at the second output terminal becomes the "L" level. Thus, the first switch 5 becomes in the close condition, and the second switch 6 becomes in the open condition.

Therefore, the first voltage Vg, which is higher than the phase difference voltage Vd, is applied to the inverted input terminal of the loop filter 4, so that the loop filter 4 functions as the integrator for integrating the differential input (Vd–Vg). Then, the control voltage Vac of the voltage control sinal is decreased, and along with this, the frequency of the output signal OUT is also decreased.

By the way, since the control voltage Vac is decreased to be lower than the first standard voltage Vm2, the output level of the first comparator 8 immediately becomes the "L" level. However, this immediate level change does not affect the flipflop circuit 7.

After that, the control voltage Vac is kept to be decreased, and, at the time t7, it reaches to the second standard voltage Vn2 corresponding to the second virtual zone, and the output level of the second comparator 9 becomes the "H" level.

By this, the output of the flipflop circuit 7 is inverted, so that the signal level at the first output terminal T1 becomes the "L" level, and the signal level at the second output terminal T2 becomes the "H" level. Thus, the first switch 5 becomes in the open condition and the second switch 6 becomes in the close condition.

Therefore, the second voltage Vh, which is lower than the phase difference voltage Vd, is applied again to the inverted input terminal of the loop filter 4, so that the loop filter 4 functions as the integrator for integrating the differential input (Vd−Vh). Thus, the control voltage Vac of the voltage control signal is increased, and along with this, the frequency of the output signal OUT is also increased.

Then, at the time t8, when the phases of the input signal IN and the output signal OUT are coincident to each other, the signal level of the lock signal LCK of the lock detection unit 14 becomes the "H" level to indicate the pulling-in operation is completed. The signal levels at both of the first output terminal T1 and the second output terminal T2 of the flipflop circuit 7 become the "L" levels respectively. Thus, both of the first switch 5 and the second switch 6 become in the open condition respectively, so that the pulling-in circuit 20 is cut off from the PLL circuit 10, and after that, the PLL circuit 10 starts to normally operate.

As described above, according to the present embodiments, the sweep range of the pulling-in circuit 20 is changed according to the change of the central frequency to which the frequency of the PLL circuit 10 is pulling-in. Namely, as the central frequency is the higher, the wider is the sweep rage. Thus, even in the inner circumferential area where the transmission rate is relatively low, or even in the outer circumferential area where the transmission rate is relatively high, the relative width of the sweep range with respect to the relevant central frequency can be made constant, so that stable and speedy pulling-in operation can be performed.

Further, in the reproducing apparatus 30 which employs the PLL circuit 10 and the pulling-in circuit 20, even if the clock frequency range is relatively wide in case of performing the CAV type reproducing operation with respect to the CLV disc, the stable pulling-in operation as well as the stable reproducing operation can be performed.

Nextly, a comparison example of the present invention will be explained with referring to FIGS. 4 and 5. The comparison example is constructed to verify the advantageous effect of the sweep range setting circuit 15 of the first embodiment of FIG. 1.

Figure 4:
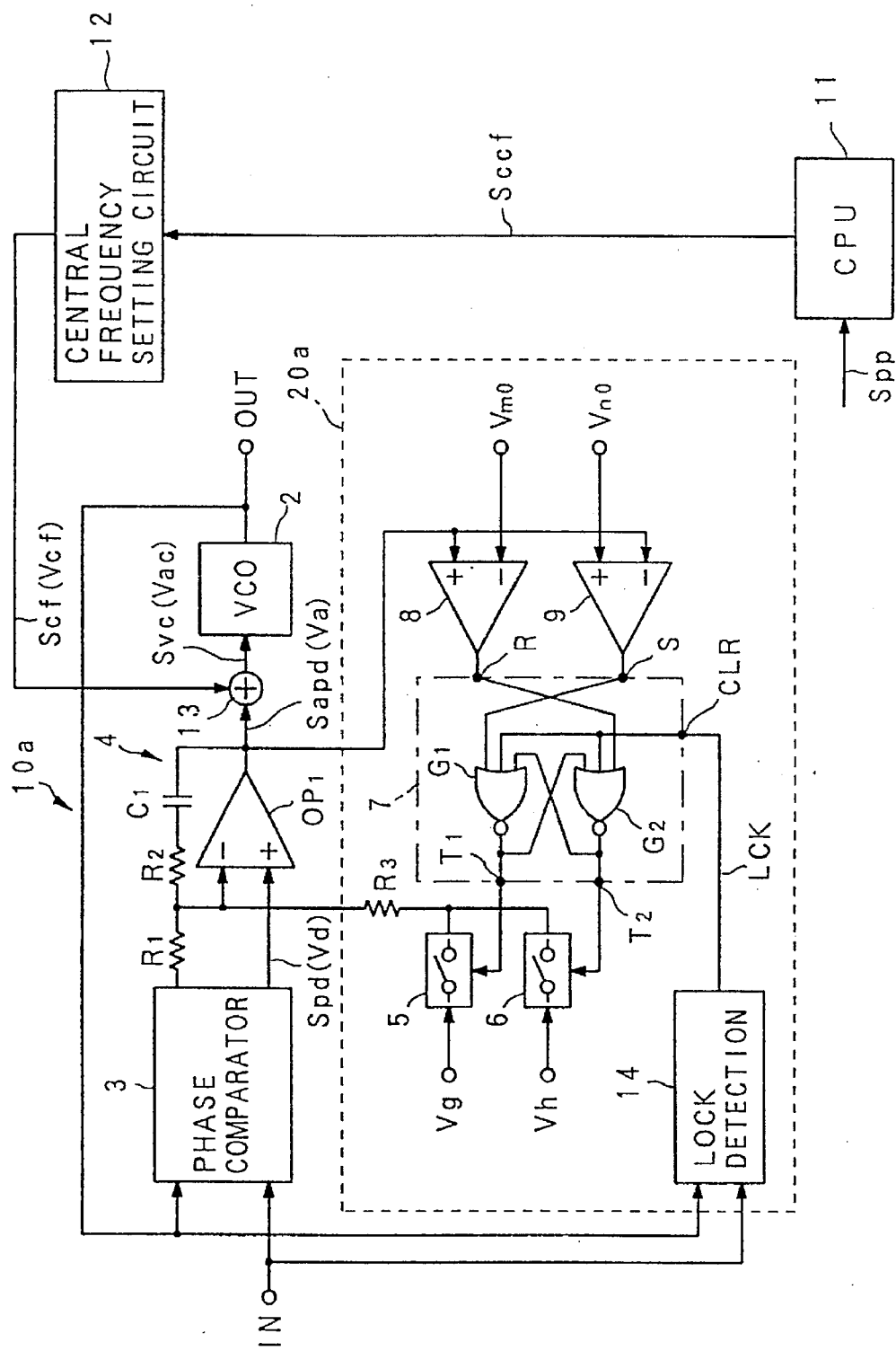
FIG. 4 is a block diagram of a PLL circuit device as a comparison example of the present invention.

As shown in FIG. 4, a PLL circuit device consisting of a PLL circuit 10a and a pulling-in circuit 20a as the comparison example has such a construction that the sweep range setting circuit 15 is omitted from the construction of the first embodiment of FIG. 1, and that a constant first standard voltage Vmo is inputted to the inverted input terminal (−) of the first comparator 8 and a constant second standard voltage Vno is applied to the non-inverted input terminal (+) of the second comparator 9. In FIG. 4, the same constitutional elements as those in the first embodiment of FIG. 1 carry the same reference numerals and the explanations thereof are omitted.

In the comparison example, the since each of the first standard voltage Vmo and the second standard voltage Vno is constant regardless of the reading position with respect to the radial direction (i.e. regardless of the central frequency), the upper and lower limit values of the sweep range for pulling-in operation is also constant regardless of the reading position with respect to the radial direction. Namely, the sweep range is varied between the first standard voltage Vmo to the second standard voltage Vn.

Figure 5:
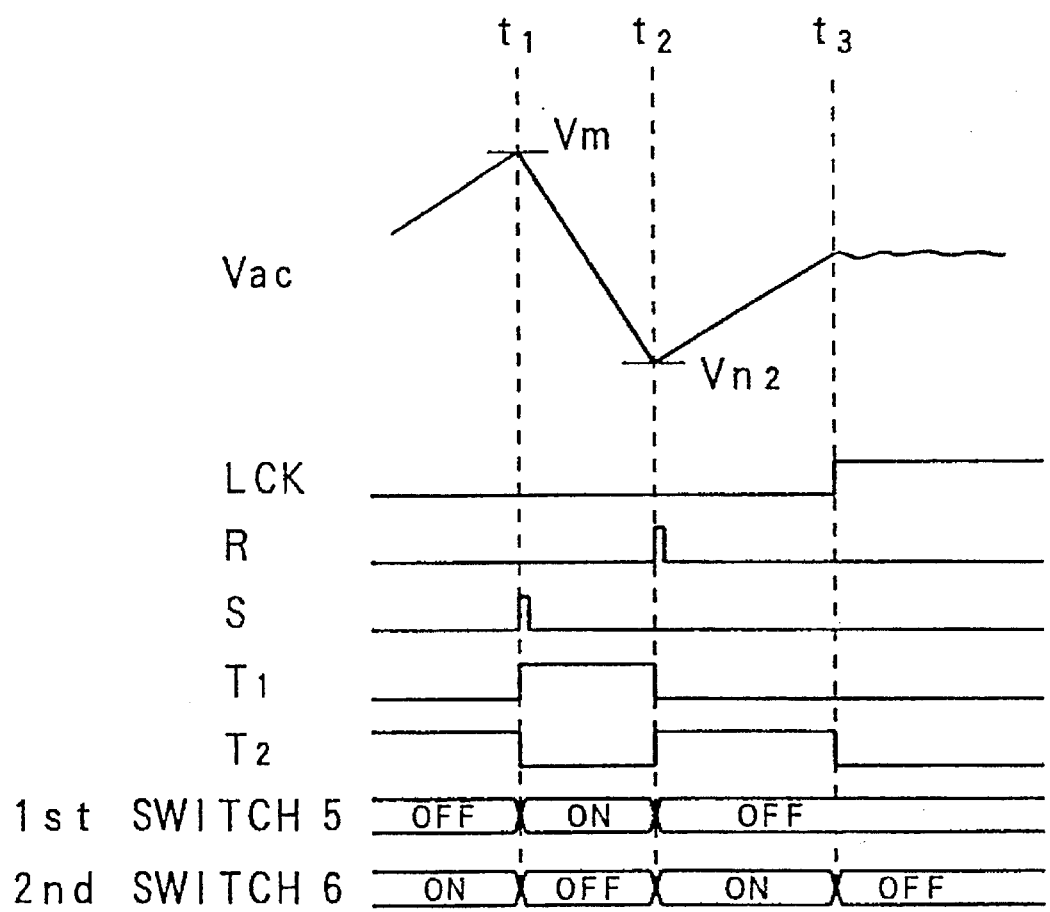
FIG. 5 is a timing chart for explaining an operation of the comparison embodiment.

The operation of the comparison example constructed in this manner is explained here with referring to FIG. 5 as well as FIG. 4.

In FIG. 5, the first voltage Vg and the second voltage Vh are set so as to satisfy the following relationship.

$Vg > Vd > Vh$

Until the time t1, since the signal level at the first output terminal T1 of the flipflop circuit 7 is the "L" level and the signal level at the second output terminal T2 is the "H" level, the first switch 5 is in the open condition and the second switch 6 is in the close condition.

By this, the second voltage Vh, which is lower than the phase difference voltage Vd, is applied to the inverted input terminal of the loop filter 4, so that the loop filter 4 functions as the integrator for integrating the differential input (Vd−Vh).

As a result, the control voltage Vac of the voltage. control signal Sapd is increased, and along with this, the frequency of the output signal OUT is also increased.

At the time t1, the control voltage Vac reaches the first standard voltage Vmo and the output level of the first comparator 8 becomes the "H" level.

By this, the output of the flipflop circuit 7 is inverted, so that the signal level at the first output terminal T1 becomes the "H" level and the signal level at the second output terminal becomes the "L" level. The first switch 5 becomes in the close condition, and the second switch 6 becomes in the open condition.

Therefore, the first voltage Vg, which is higher than the phase difference voltage Vd, is applied to the inverted input terminal of the loop filter 4, so that the loop filter 4 function as the integrator for integrating the differentia input (Vd−Vg). The control voltage Vac of the voltage control signal Sapd is decreased, and along with this, the frequency of the output signal OUT is also decreased.

By the way, since the control voltage Vac is decreased to be lower than the first standard voltage Vmo, the output level of the first comparator 8 immediately becomes the "L" level. However, this immediate change does not affect the flipflop circuit 7.

After that, the control voltage Vac is kept to be decreased, and at the time t2, it reaches the second standard voltage Vno, and the output level of the second comparator 9 becomes the "H" level.

By this, the output of the flipflop circuit 7 is inverted, so that the signal level at the first output terminal T1 becomes the "L" level, and the signal level at the second terminal becomes the "H" level. Thus, the first switch 5 becomes in the open condition, and the second switch 6 becomes in the close condition.

Therefore, the second voltage Vh, which is lower than the phase difference voltage Vd, is applied again to the inverted input terminal of the loop filter 4, so that the loop filter 4 functions as the integrator for integrating the differential input (Vd−Vh). Then, the control voltage Vac of the voltage control signal Sapd is increased, and along with this, the frequency of the output signal OUT is also increased.

Then, at the time t3, when the phases of the input signal IN and the output signal OUT are coincident to each other, the level of the lock signal LCK of the lock detection unit 11 becomes the "H" level to indicate that the pulling-in operation is completed. Thus, the signal levels at both of the first output terminal T1 and the second output terminal T2 of the flipflop circuit 7 become the "L" level, and both of the first switch 5 and the second switch 6 become in the open condition, so that the pulling-in circuit 20a is cut off from the PLL circuit 10a. Thus, after that, the PLL circuit 10a starts to normally operate.

In this manner, without the sweep range setting circuit 15 of FIG. 1, if the sweep range is fixed to be suitable for the inner circumferential area where the transmission rate is low, the sweep range is too narrow at the outer circumferential area to perform the stable pulling-in operation according to the comparison example. Further, if the sweep range is fixed to be suitable for the outer circumferential area where the transmission rate is high, the sweep range is too wide at the inner circumferential area to perform the speedy pulling-in operation (i.e. it takes long time to perform the pulling-in operation) according to the comparison example.

On the contrary to the comparison example of FIG. 4, the embodiments of FIG. 1 can perform the stable and speedy pulling-in operation even if the frequency range to deal with in the PLL circuit is wide, by the virtue of the sweep range setting circuit 15 by appropriately changes the upper limit value and the lower limit value of the sweep range during the CAV type reproducing operation with respect to the CLV disc.

As described above in detail, according to the pulling-in circuit 20 for the PLL circuit 10 of the present embodiment, the stable and speedy pulling-in operation can be performed with respect to the sweep range based on the central frequency set by the central frequency setting circuit 12. Thus, regardless of the frequency of the input signal IN, the pulling-in operation can be performed by use of a sweep range suitable for the input signal IN just by setting the central frequency in accordance with the frequency of the input signal IN.

Further, even if the frequency range for the PLL operation is wide, the PLL operation can be still performed by use of a sweep range which is varied to be suitable for the frequency of the current input signal IN.

Furthermore, if the reading position is near the most inner circumferential side of the optical disc 31 where the data transmission rate is low (e.g. 2.8 MHz=350 kBytes/sec), the relatively narrow sweep range (e.g. 344 to 356 kBytes/sec) is employed so that it is possible to perform the pulling-in operation speedily. If the reading position is near the most outer circumferential side where the data transmission rate is high (e.g. 7 MHz=875 kBytes/sec), the relatively wide sweep range (e.g. 860 to 890 kBytes/sec) is employed so that it is possible to perform the pulling-in operation stably, according to the present embodiments. Thus, the access time can be drastically decreased in case that the CD-ROM of CLV type is reproduced by the CAV type reproducing operation for each virtual zones by use of the reproducing apparatus 30 of the present embodiment.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and range of equivalency of the claims are therefore intended to be embraced therein.

What is claimed is:

1. A pulling-in circuit for a PLL circuit to which an input signal is inputted, said PLL circuit comprising: a voltage controlled oscillator for outputting an output signal; a control voltage generation circuit for generating a control voltage to lock phases of the input and output signals by a loop, and outputting the generated control voltage to a control input terminal of said voltage controlled oscillator; and a central frequency setting circuit for setting a central frequency, to which a frequency of the output signal is to be pulled-in, to said control voltage generation circuit, said pulling-in circuit comprising:

a sweep range setting circuit for setting a sweep range, where the frequency of the output signal is to be pulled-in to the set central frequency, on the basis of the set central frequency;

a lock detector for detecting whether or not a pulling-in operation is completed in said PLL circuit, and outputting a lock signal when the pulling-in operation is detected to be completed; and a sweep range control circuit for controlling said control signal generation circuit to generate the control signal to repeatedly sweep the frequency of the output signal through the set sweep range during the pulling-in operation until the lock signal is supplied thereto.

2. A pulling-in circuit according to claim 1, in which said central frequency setting circuit sets the central frequency by adding a central frequency voltage corresponding to the central frequency onto the control voltage, wherein said sweep range control circuit controls said control signal generation circuit to sweep the control voltage through a voltage range corresponding to the set sweep range.

3. A pulling-in circuit according to claim 2, in which said control signal generation circuit comprises: a phase comparator for comparing the phases of the input and output signals to output a phase difference voltage; a loop filter for amplifying the phase difference voltage to output an amplified voltage which is swept through the voltage range by said sweep range control circuit; and an adder for adding the central frequency voltage onto the amplified voltage to output the control voltage, wherein said sweep range control circuit comprises:

a direct voltage applying circuit for selectively applying one of two direct voltages, which have levels different from each other, to an input of said loop filter; and a switching circuit for switching the applied one of two direct voltages to another when the control voltage reaches each of an upper limit and a lower limit of the voltage range.

4. A pulling-in circuit according to claim 1, wherein said sweep range setting circuit comprises:

an upper limit setting circuit for setting an upper limit value of the sweep range on the basis of the central frequency; and a lower limit setting circuit for setting a lower limit value of the sweep range on the basis of the central frequency.

5. A pulling-in circuit according to claim 2, wherein said sweep range setting circuit comprises:

an upper limit setting circuit for setting an upper limit voltage of the voltage range on the basis of the central frequency voltage; and a lower limit setting circuit for setting a lower limit voltage of the voltage range on the basis of the central frequency voltage.

6. A pulling-in circuit according to claim 5, wherein said upper limit setting circuit sets the upper limit voltage by adding a result of multiplying the central frequency voltage by a first proportional coefficient P1 (P1>0) onto the central frequency voltage; and said lower limit setting circuit sets the lower limit voltage by subtracting a result of multiplying the central frequency voltage by a second proportional coefficient P2 (P2>0) from the central frequency voltage.

7. A pulling-in method for a PLL circuit to which an input signal is inputted, said PLL circuit comprising: a voltage controlled oscillator for outputting an output signal; a control voltage generation circuit for generating a control voltage to lock phases of the input and output signals by a loop, and outputting the generated control voltage to a control input terminal of said voltage controlled oscillator; and a central frequency setting circuit for setting a central frequency, to which a frequency of the output signal is to be pulled-in, to said control voltage generation circuit, said pulling-in method comprising the steps of:

setting a sweep range, where the frequency of the output signal is to be pulled-in to the set central frequency, on the basis of the set central frequency;

detecting whether or not a pulling-in operation is completed in said PLL circuit, and outputting a lock signal when the pulling-in operation is detected to be completed; and controlling said control signal generation circuit to generate the control signal to repeatedly sweep the frequency of the output signal through the set sweep range during the pulling-in operation until the lock signal is outputted.

8. A pulling-in method according to claim 7, in which said central frequency setting circuit sets the central frequency by adding a central frequency voltage corresponding to the central frequency onto the control voltage, wherein said controlling step comprises the step of controlling said control signal generation circuit to sweep the control voltage through a voltage range corresponding to the set sweep range.

9. A pulling-in method according to claim 8, in which said control signal generation circuit comprises: a phase comparator for comparing the phases of the input and output signals to output a phase difference voltage; a loop filter for amplifying the phase difference voltage to output an amplified voltage which is swept through the voltage range by said sweep range control circuit; and an adder for adding the central frequency voltage onto the amplified voltage to output the control voltage, wherein said controlling step comprises the steps of:

selectively applying one of two direct voltages, which have levels different from each other, to an input of said loop filter; and switching the applied one of two direct voltages to another when the control voltage reaches each of an upper limit and a lower limit of the voltage range.

10. A pulling-in method according to claim 7, wherein said sweep range setting step comprises the steps of:

setting an upper limit value of the sweep range on the basis of the central frequency; and setting a lower limit value of the sweep range on the basis of the central frequency.

11. A pulling-in method according to claim 8, wherein said sweep range setting step comprises the steps of:

setting an upper limit voltage of the voltage range on the basis of the central frequency voltage; and setting a lower limit voltage of the voltage range on the basis of the central frequency voltage.

12. A pulling-in method according to claim 11, wherein said upper limit setting step comprises the step of setting the upper limit voltage by adding a result of multiplying the central frequency voltage by a first proportional coefficient P1 (P1>0) onto the central frequency voltage; and said lower limit setting step comprises the step of setting the lower limit voltage by subtracting a result of multiplying the central frequency voltage by a second proportional coefficient P2 (P2>0) from the central frequency voltage.

13. A PLL circuit device comprising a PLL circuit, to which an input signal is inputted, and a pulling-in circuit, said PLL circuit comprising:

a voltage controlled oscillator for outputting an output signal;

a control voltage generation circuit for generating a control voltage to lock phases of the input and output signals by a loop, and outputting the generated control voltage to a control input terminal of said voltage controlled oscillator;

and a central frequency setting circuit for setting a central frequency, to which a frequency of the output signal is to be pulled-in, to said control voltage generation circuit, said pulling-in circuit comprising:

a sweep range setting circuit for setting a sweep range, where the frequency of the output signal is to be pulled-in to the set central frequency, on the basis of the set central frequency;

a lock detector for detecting whether or not a pulling-in operation is completed in said PLL circuit, and outputting a lock signal when the pulling-in operation is detected to be completed; and a sweep range control circuit for controlling said control signal generation circuit to generate the control signal to repeatedly sweep the frequency of the output signal through the set sweep range during the pulling-in operation until the lock signal is supplied thereto.

14. A PLL circuit device according to claim 13, wherein said central frequency setting circuit sets the central frequency by adding a central frequency voltage corresponding to the central frequency onto the control voltage, and said sweep range control circuit controls said control signal generation circuit to sweep the control voltage through a voltage range corresponding to the set sweep range.

15. A PLL circuit device according to claim 13, wherein said control signal generation circuit comprises:

a phase comparator for comparing the phases of the input and output signals to output a phase difference voltage;

a loop filter for amplifying the phase difference voltage to output an amplified voltage which is swept through the voltage range by said sweep range control circuit; and an adder for adding the central frequency voltage onto the amplified voltage to output the control voltage.

16. A PLL circuit device according to claim 15, wherein said sweep range control circuit comprises:

a direct voltage applying circuit for selectively applying one of two direct voltages, which have levels different from each other, to an input of said loop filter; and a switching circuit for switching the applied one of two direct voltages to another when the control voltage reaches each of an upper limit and a lower limit of the voltage range.

* * * * *